United States Patent [19]
Yokota et al.

[11] Patent Number: 6,071,629
[45] Date of Patent: Jun. 6, 2000

[54] ORGANIC RUST-PROOF TREATED COPPER FOIL

[75] Inventors: Toshiko Yokota; Makoto Dobashi, both of Ageo; Hiroshi Hata, Kawagoe; Hisao Sakai, Kitaadachi-gun; Susumu Takahashi, Kawagoe; Junshi Yoshioka, Ageo, all of Japan

[73] Assignee: Mitsui Mining & Smelting Co., Ltd., Japan

[21] Appl. No.: 08/785,688

[22] Filed: Jan. 17, 1997

Related U.S. Application Data

[63] Continuation of application No. 08/496,502, Jun. 29, 1995, abandoned.

[30] Foreign Application Priority Data

Dec. 5, 1994 [JP] Japan .................................. 6-329294

[51] Int. Cl.$^7$ ........................ B21D 39/00; C03C 27/02; C23C 27/82
[52] U.S. Cl. ........................ 428/621; 428/622; 428/623; 428/624; 428/632; 428/658; 428/674; 148/265; 148/269
[58] Field of Search ...................... 428/621, 622, 428/624, 632, 658, 674, 623, 626; 148/265, 269

[56] References Cited

U.S. PATENT DOCUMENTS

| | | | |
|---|---|---|---|
| 3,716,421 | 2/1973 | Burkhart et al. | 148/6.14 R |
| 4,357,396 | 11/1982 | Grunewalder et al. | 428/626 |
| 4,705,642 | 11/1987 | Sung et al. | 252/47.5 |
| 5,567,534 | 10/1996 | Yano et al. | 428/607 |

FOREIGN PATENT DOCUMENTS

| | | |
|---|---|---|
| 0061986 | 10/1982 | European Pat. Off. . |
| 0249162 | 12/1987 | European Pat. Off. . |
| 0462808 | 12/1991 | European Pat. Off. . |
| 0490161 | 6/1992 | European Pat. Off. . |
| 0600411 | 6/1994 | European Pat. Off. . |
| 0700238 | 3/1996 | European Pat. Off. . |
| 7220906 | 1/1973 | France . |
| 60-218484 | 11/1985 | Japan . |
| 3211298 | 6/1992 | Japan . |
| 685455 | 8/1992 | Japan . |
| 6-85417 | 3/1994 | Japan . |
| 6085417 | 3/1994 | Japan . |
| 6085455 | 3/1994 | Japan . |
| 8-120049 | 7/1996 | Japan . |

*Primary Examiner*—Paul Thibodeau
*Assistant Examiner*—Holly C. Rickman
*Attorney, Agent, or Firm*—Morrison Law Firm

[57] ABSTRACT

An organic rust-roof treated copper foil characterized in that it has a metallic rust-proof layer formed on the non-adhesive side of the original copper foil and has an organic rust-proof layer formed on said metallic rust-proof layer, the organic rust-proof layer comprising a mixture of at least two kinds of chemicals selected from the group consisting of benzotriazole, its derivatives, aminotriazole and its isomers and derivatives is provided with on said metallic rust-proof layer, or it further has a chromate-treated layer formed between said metallic rust-proof layer and said organic rust-proof layer.

10 Claims, No Drawings

ORGANIC RUST-PROOF TREATED COPPER FOIL

This is a Continuation of application Ser. No. 08/496,502 filed Jun. 29, 1995 now abandoned.

BACKGROUND OF THE INVENTION

1. Field of the Invention

This invention relates to an organic rust-proof treated copper foil and, more particularly, it relates to such a copper foil which can prevent a dust composed mainly of powdered epoxy resin from adhering to the copper foil at the time of adhering the copper foil to a substrate and is useful in the preparation of a printed wiring board.

2. Prior Art

For manufacturing a printed wiring board, a copper foil and a substrate such as an epoxy resin-impregnated glass fiber substrate are bonded together by applying heat and pressure and then the portions of the copper foil that are not necessary for making a circuit are removed by means of an acidic or alkaline etching solution. After forming the circuit and arranging additional electronic components on the circuit board, the board is dipped in a solder bath for securing the components to the board.

A copper foil to be used as a material for a circuit board has a zinc, zinc alloy or other metallic rust-proof layer formed thereon by electroplating and is subjected to surface treatments such as chromate treatment aid silane coupling agent treatment in order to meet the requirements for the circuit board, specially to prevent the rusting and the discoloration of the copper foil which may be caused due to heat at the time of adhesion of the foil to a substrate, after which the copper foil so treated is adhered to the substrate such as all epoxy resin-impreginated glass fiber substrate and then put to practice. A copper foil herein used is normally all electrodeposited one which has a matte (rough) side or surface to be generally adhered to a substrate and a glossy (smooth) side that is generally not adhered to the substrate.

The side of the copper foil not adhered to a substrate (such a side being hereinafter referred to as a "non-adhesive side") is required to have satisfactory heat oxidation resistance, solder wettability, resist ink receptability, etching susceptibility and chemical polishability.

In order to adhere a copper foil to a substrate under heat and pressure as described above, a copper foil and a substrate are put one upon another to form a laminate, after which such laminates are put one upon another with a stainless steel plate inserted as a separator between any adjecent two laminates and the whole is then pressed at a predetermined pressure and temperature thereby to adhere the copper foil to the substrate in each of the laminates. If, at this time, fine particles of an epoxy resin coming out of the substrate and a dust in the air are adhered to the non-adhesive side, they will firmly be adhered to the surface of the copper foil thereby to hinder etching during the formation of conductor circuits and cause a short circuit. This has been a serious problem. The above phenomenon is generally referred to as "resin spots". Thus, the non-adhesive side of the copper foil is specially required to have no resin spots thereon in addition to the previously mentioned requirements for the copper foil.

A well known method of organic rust-proof treatment of copper and copper alloys involves the use of benzotriazole (BTA) or a derivative thereof. BTA is also used for ten temporary organic rust-proof treatment of copper foils when they are stored before use.

Like BTA, tolyltriazole (TTA) is also used as an antidiscoloration and rust-proof agent for copper and copper alloys. See the February 1993 issue of "BOSEI KANRI (rust-proof Management)", p. 1.

In recent years, the use of carboxybenzotriazole (the November 1993 issue of "BOSEI KANRI", p. 11) and that of 3-amino-1,2,4-triazole and other BTA derivatives ("BOSEI KANRI"; November 1993, p.6) have been proposed and studied as heat-resistive organic rust-proof agents.

There are known methods for treating the surface of copper foils with BTA or a BTA derivative in order to improve the glossy side of the copper foils in long-term preservability (moisture resistance), wettability (or compatibility) with solder and resist receptability. (See, for example, Japanese Patent Pat. Appln. Nos. Hei 6-85417 and Hei 6-85455 or Nos. 85417/94 and 85455) However, it is not known at all to date to eliminate the formation of resin spots on copper foils by using a mixture of a heat-resistant BTA derivative and aminotriazole in stead of using BFA or a BTA derivative alone.

SUMMARY OF THE INVENTION

It is therefore an object of the present invention to solve the problems as to these conventional techniques and provide an organic rust-proof treated copper foil which prevents resin spots from being formed thereon without lowering various performances of a copper foil to be used as a material for a circuit board.

According to the invention, the above object is achieved by forming on the non-adhesive side of a copper foil an organic rust-proof layer comprising a mixture of at least two kinds of chemicals selected from benzotriazole, a derivative thereof, aminotriazole and all isomer and derivative thereof.

More specifically, an organic rust-proof treated copper foil according to the present invention is characterized in that it has on the non-adhesive side a metallic barrier layer and further has on the metallic barrier layer either an organic rust-proof layer comprising a mixture of at least two kinds of chemicals selected from benzotriazole and a derivative thereof as well as aminotriazole and an isomer and derivative thereof; or else it has a metallic barrier layer on the non-adhesive side of the copper foil, a chromate-treated layer on the metallic barrier layer and an organic rust-proof layer on the chromate-treated layer, the organic rust-proof layer having the same composition as the aforementioned one.

As described above, the organic rust-proof treated copper foil of the invention has a metallic barrier layer on the non-adhesive side thereof. The metallic barrier layer is preferably a layer of zinc or a zinc alloy. A variety of methods are known for forming a zinc or zinc alloy layer on a copper foil by plating and any of these known plating methods may be used for the purpose of the invention. So long as zinc is used as the principal ingredient of the metal layer, one or more third metals may be contained therein in a small proportion.

The composition of a zinc plating bath and conditions for plating, which may be used in the present invention, are illustrated hereunder. Any other compositions and conditions may be used herein as far as they can provide the same zinc or zinc alloy layer on a copper foil by plating.

| <zinc plating> | |
|---|---|
| zinc pyrophosphate | 1 to 10 g/liter |
| potassium pyrophosphate | 100 g/liter |
| pH | 9 to 12 |
| bath temperature | room temperature |
| current density | 0.1 to 1 A/dm$^2$ |

The copper foil of the present invention may have a chromate-treated layer formed on the above metallic barrier layer formed on the non-adhesive side of the copper foil. The chromate treatment may be carried out by means of electroplating or immersion; any a usually-used ordinary chromate treatment technique.

The composition of a chromate-treatment solution and conditions for the treatment, which may be used herein, are illustrated below. Any other compositions and conditions may be used as far as they can provide the same chromate-treated layer on a zinc or zinc alloy layer.

| <chromate treatment> | |
|---|---|
| chromic acid | 0.05 to 10 g/liter |
| pH | 9 to 13 |
| current density | 0.1 to 5 A/dm$^2$ |

The copper foil of the invention has on the metallic barrier layer formed on the non-adhesive side of the copper foil or on the chromate-treated layer formed on said metallic barrier layer, all organic rust-proof layer comprising a mixture of at least two kinds of chemicals selected from the group consisting of benzotriazole and a derivative thereof, and aminotriazole and an isomer and derivative thereof. said mixture of at least two kinds of the specified organic compounds is used in the form of an aqueous solution and may be applied by means of immersion, or coating by spraying or a roll.

Benzotriazole derivatives that can be used for the purpose of the invention include heat-resistant carboxybenzotriazole, tolyltriazole and sodium salts of carboxybenzotriazole and tolyltriazole as well as amino-compounds of carboxybenzotriazole and tolyltriazole, said amino compounds being illustrated by monoethanolamine salts, cyclohexylamine salts, diisopropylamine salts and morpholine salts.

Isomers of aminotriazole that can be used for the purpose of the invention include 3-amino-1,2,4-triazole , 2-amino-1,3,4-triazole, 4-amino-1,2,4-triazole and 1-amino-1,3,4-triazole.

Derivatives of aminotriazole that can be used for the purpose of the invention include sodium salts of aminotriazole and amino-compounds of aminotriazole, said amino compounds being illustrated by monoethanolamine salts, cyclohexylamine salts, diisopropylamine salts and morpholine salts.

The concentrations of the compounds used in the organic rust-proof treatment solution used herein are illustrated as follows:

| benzotriazole | 0.01 to 2 wt % |
|---|---|
| tolyltriazole | 0.01 to 1 wt % |
| carboxybenzotriazole | 0.01 to 0.035 wt % |
| aminotriazole | 0.01 to 25 wt % |

The organic rust-proof treatment solution contains at least two kinds of these compounds in admixture.

A copper foil which is used in the preparation of an organic rust-proof treated copper foil of the present invention may be an electrodeposited copper foil, a rolled wrought copper foil or the like, and these copper foils are not particularly limited about foil thickness.

According to the present invention, the surface of a copper foil to be adhered to a substrate (such a surface being hereinafter referred to as an "adhesive side") is treated by an ordinary technique. More specifically, the adhesive side of the copper foil has a nodular copper layer formed thereon, is plated with a metal, has a metallic barrier layer composed of zinc, a zinc alloy or the like formed thereon and then has a chromate-treated layer formed on the metallic barrier layer, the chromate-treated layer being formed for improving the copper foil in chemical resistance. The formation of the metallic rust-proof layer and chromate-treated layer is carried out on both the adhesive side and the non-adhesive side of the copper foil usually at the same time. No organic rust-proof treatment is carried out on the adhesive side of the copper foil.

An organic rust-proof treated copper foil of the present invention obtained after the end of the above treatments and after being dried, will not form resin spots when it is adhered to a circuit board, and the non-adhesive side of the copper foil also exhibits its other performances to be satisfactory.

DESCRIPTION OF THE PREFERRED EMBODIMENTS

Now, the invention will be better understood by the following Examples in comparison with Comparative Examples.

EXAMPLES 1 through 10

The non-adhesive sides of ordinary electrodeposited copper foils were plated with 20 mg/m$^2$ of zinc, rinsed with water and then electrolytically treated with a chromate. Thereafter, these copper foils were subjected to organic rust-proof treatment with organic rust-proof treatment solutions listed in Table 1 and comprising a mixture of at least two kinds of chemicals selected from the group consisting of benzotriazole and a derivative thereof, and aminotriazole and an isomer or derivative thereof, thereafter dried and then tested for resin spots. The organic rust-proof treatment solutions respectively contained 0.1% of 2–3 kinds of organic rust-proof agents as specifically indicated in the following Table 1, and they were coated on the copper foil at normal temperature.

(Resin Mark Resistance)

Each of the copper foils so obtained was placed on an epoxy-impreginated glass fiber substrate to form a laminate. After powder of an epoxy resin had been spreaded on the non-adhesive face of the copper foil, which was not to be adhered onto the substrate, a plurality of the same laminates as above were piled one upon another with a stainless steel plate inserted between any adjacent two laminates as a separator and then heated and pressed together. The number of epoxy resin spots stuck on each of the stainless steel plates and on the said non-adhesive face of each of the copper foils were visually counted to find the resin mark resistance of the steel plate and non-adhesive face.

The test results are also shown in Table 1. In Table 1, the following abbreviations are used: ATA: aminotriazole, BTA: benzotriazole, TTA: tolyltriazole, C-BTA: carboxybenzotriazole.

Comparative Example 1

The same ordinary electrolytic copper foil as used in Example 1 was plated on the non-adhesive side with 20 mg/m$^2$ of zinc as in the case of Example 1. The resin spots of the copper foil was also evaluated as in Example 1, with the result being shown in Table 1.

Comparative Example 2

The same ordinary electrolytic copper foil as used in Example 1 was plated with zinc on the non-adhesive side thereof in an amount of 20 mg/m$^2$ and then elecrolytically treated with a chromate in the same manner as in Example 1. The copper foil thus obtained was also evaluated for resin spots as in Example 1, and the test result obtained is also shown in Table 1.

Comparative Examples 3–6

Each of the same ordinary electrolytic copper foils as used in Example 1 was plated with zinc on the non-adhesive side in an amount of 20 mg/m$^2$ and then elecrolytically treated with a chromate in the same manner as in Example 1. Then, the copper foils thus treated were subjected to treatment with an organic rust-proof treating solution containing one chemical selected from the group consisting of benzotriazole, its derivatives thereof, aminotriazole and its isomers and derivatives and then dried. Each of the organic rust-proof treating solutions contained 0.1% by weight of one chemical of the above compounds and applied at normal temperature. The copper foils thus obtained were also evaluated for resin spots as in Example 1, and the test results obtained are also shown in Table 1.

TABLE 1

| Ex. and Comp. Ex. | Treatment with organic anti-rust agent | Number of resin-spots stuck on copper foil |
|---|---|---|
| Ex. 1 | ATA + BTA | none |
| Ex. 2 | ATA + TTA | none |
| Ex. 3 | ATA + C – BTA | none |
| Ex. 4 | BTA + TTA | none |
| Ex. 5 | BTA + C – BTA | none |
| Ex. 6 | TTA + C – BTA | none |
| Ex. 7 | ATA + BTA + TTA | none |
| Ex. 8 | ATA + BTA + C – BTA | none |
| Ex. 9 | ATA + TTA + C – BTA | none |
| Ex. 10 | ATA + BTA + C – BTA + TTA | none |
| Comp. Ex. 1 | none (only zinc plating) | many |
| Comp. Ex. 2 | none (zinc plating + electrolytic chromate treatment) | many |
| Comp. Ex. 3 | BTA | appreciable |
| Comp. Ex. 4 | ATA | appreciable |
| Comp. Ex. 5 | TTA | appreciable |
| Comp. Ex. 6 | C – BTA | appreciable |

Examples 11 through 20

Each of ordinary electrolytic copper foils was plated on the non-adhesive side thereof with zinc in an amount of 20 mg/m$^2$. After rinsing with water, the copper foils thus plated were subjected to treatment with an organic rust-proof treating solution comprising a mixture of at least two kinds of chemicals selected from the group consisting of benzotriazole, its derivatives, aminotriazole and its isomers and derivatives as shown in Table 2, thereafter dried and then evaluated for resin spots. Each of the organic rust-proof treating solutions contained 0.1% by weight of two to four of the above compounds concentration of 0.1% by weight and applied to the plated copper foil at normal temperature. The copper foils thus obtained were also tested for resin spots as in Example 1, and the test results obtained are also shown in Table 2.

Comparative Examples 7–10

Each of the same ordinary electrolytic copper foils as used in Example 1 was plated on the non-adhesive side thereof with zinc in an amount of 20 mg/m$^2$. The copper foils thus plated were treated with an organic rust-proof treating solution containing one chemical selected from the group consisting of benzotriazole, its derivatives, aminotriazole and its isomers and derivatives and then dried. Each of the organic rust-proof treating solutions contained 0.1 wt.% of one chemical of the above compounds and applied to the plated copper foil at normal temperature. The copper foils thus obtained were also tested for resin spots in the same manner as in Example 1, and the test results obtained are also shown in Table 2.

TABLE 2

| Ex. and Comp. Ex. | Treatment with organic anti-rust agent | Number of resin-spots stuck on copper foil |
|---|---|---|
| Ex. 11 | ATA + BTA | none |
| Ex. 12 | ATA + TTA | none |
| Ex. 13 | ATA + C – BTA | none |
| Ex. 14 | BTA + TTA | none |
| Ex. 15 | BTA + C – BTA | none |
| Ex. 16 | TTA + C – BTA | none |
| Ex. 17 | ATA + BTA + TTA | none |
| Ex. 18 | ATA + BTA + C – BTA | none |
| Ex. 19 | ATA + TTA + C – BTA | none |
| Ex. 20 | ATA + BTA + C – BTA + TTA | none |
| Comp. Ex. 7 | BTA | many |
| Comp. Ex. 8 | ATA | many |
| Comp. Ex. 9 | TTA | many |
| Comp. Ex. 10 | C – BTA | many |

From Tables 1 and 2, it is found that a copper foil having been subjected to organic rust-proof treatment with a rust-proof treating solution containing a mixture of at least two kinds of chemicals selected from benzotriazole, its derivative, aminotriazole and its isomers and derivatives, is effective for suppressing the formation of resin spots.

(Effect of the Invention)

The organic rust-proof treated copper foil of the present invention can solve the problem as to the adhesion of a dust to the non-adhesive side of the copper foil at the time of adhering the copper foil for a circuit board to the substrate and prevent troubles such as short-circuiting caused due to the presence of resin spots.

What is claimed is:

1. An organic rust-proof treated copper foil, said organic rust-proof treated copper foil having a face to be adhered and an opposite face, wherein prior to adhering said organic rust-proof treated copper foil said organic rust-proof treated copper foil includes a zinc or zinc alloy rust-proof layer formed on said opposite face of said copper foil and further has an organic resin spot prevention layer formed on said zinc or zinc alloy rust-proof layer, said organic resin spot prevention layer effective to prevent resin-spots, said organic resin spot prevention layer comprising a mixture of at least one member selected from the group consisting of benzotriazole and derivatives of benzotriazole, and at least one member selected from the group consisting of aminotriazole, isomers of aminotriazole, and derivatives of aminotriazole.

2. An organic rust-proof treated copper foil, said organic rust-proof treated copper foil having a face to be adhered and an opposite face, wherein prior to adhering said organic rust-proof treated copper foil said organic rust-proof treated copper foil includes a zinc or zinc alloy rust-proof layer formed on said opposite face of said copper foil, further has a chromate-treated layer formed on said zinc or zinc alloy rust-proof layer and still further has an organic resin spot prevention layer formed on said chromate-treated layer, said organic resin spot prevention layer effective to prevent resin-spots, said organic rust-proof layer comprising a mixture of at least one member selected from the group consisting of benzotriazole and derivatives of benzotriazole, and at least one member selected from the group consisting of aminotriazole, isomers of aminotriazole, and derivatives of aminotriazole.

3. An organic rust-proof treated copper foil according to claim 1, wherein said benzotriazole derivative is carboxybenzotriazole, tolyltriazole, sodium salt of carboxybenzotriazole, sodium salt of tolyltriazole, monoethanolamine salt of carboxybenzotriazole, monoethanolamine salt of tolyltriazole, cyclohexamine salt of carboxybenzotriazole, cyclohexamine salt of tolyltriazole, diisopropylamine salt of carboxybenzotriazole, diisopropylamine salt of tolyltriazole, morpholine salt of carboxybenzotriazole, or morpholine salt of tolyltriazole.

4. An organic rust-proof treated copper foil according to claim 1, wherein said isomer of aminotriazole is 3-amino-1,2,4-triazole, 2-amino-1,3,4- triazole, 4-amino-1,2,4-triazole, or 1-amino-1,3,4- triazole.

5. An organic rust-proof treated copper foil according to claim 1, wherein said aminotriazole derivative is sodium salt of aminotriazole, monoethanolamine salt of aminotriazole, cyclohexamine salt of aminotriazole, diisopropylamine salt of aminotriazole, or morpholine salt of aminotriazole.

6. An organic rust-proof treated copper foil according to claim 2, wherein said benzotriazole derivative is carboxybenzotriazole, tolyltriazole, sodium salt of carboxybenzotriazole, sodium salt of tolyltriazole, monoethanolamine salt of carboxybenzotriazole, monoethanolamine salt of tolyltriazole, cyclohexamine salt of carboxybenzotriazole, cyclohexamine salt of tolyltriazole, diisopropylamine salt of carboxybenzotriazole, diisopropylamine salt of tolyltriazole, morpholine salt of carboxybenzotriazole, or morpholine salt of tolyltriazole.

7. An organic rust-proof treated copper foil according to claim 2, wherein said isomer of aminotriazole is 3-amino-1,2,4-triazole, 2-amino-1,3,4-triazole, 4-amino-1,2,4-triazole, or 1-amino-1,3,4-triazole.

8. An organic rust-proof treated copper foil according to claim 2, wherein said aminotriazole derivative is sodium salt of aminotriazole, monoethanolamine salt of aminotriazole, cyclohexamine salt of aminotriazole, diisopropylamine salt of aminotriazole, or morpholine salt of aminotriazole.

9. A method to treat a copper foil having a face to be adhered and an opposite face for use as a circuit board material, comprising the steps of:

forming one of a zinc or zinc alloy rust-proof layer on said opposite face;

forming an organic resin spot prevention layer on said zinc or zinc alloy rust-proof layer, said organic resin spot prevention layer effective to prevent resin-spots, said organic resin spot prevention layer comprising a mixture of at least one member selected from the group consisting of benzotriazole and derivatives of benzotriazole; and at least one member selected from the group consisting of aminotriazole, isomers of aminotriazole, and derivatives of aminotriazole; and as a final step, adhering said organic resin spot prevention treated copper foil to a substrate.

10. A method to treat a copper foil having a face to be adhered and an opposite face for use as a circuit board material comprising the steps of:

forming one of a zinc or zinc alloy rust-proof layer on said opposite face;

forming a chromate-treated layer on said zinc or zinc alloy rust-proof layer;

forming an organic resin spot prevention layer on said chromate treated layer, said resin spot prevention layer being effective to prevent resin spots, said organic resin spot prevention layer comprising a mixture of at least one member selected from the group consisting of benzotriazole and derivatives of benzotriazole, and at least one member selected from the group consisting of aminotriazole, isomers of aminotriazole, and derivatives of aminotriazole; and as a final step, adhering said organic resin spot prevention treated copper foil to a substrate.

* * * * *